United States Patent
Kwark et al.

(10) Patent No.: US 7,303,113 B2
(45) Date of Patent: Dec. 4, 2007

(54) METHOD AND STRUCTURE FOR CONTROLLED IMPEDANCE WIRE BONDS USING CO-DISPENSING OF DIELECTRIC SPACERS

(75) Inventors: Young Hoon Kwark, Chappaqua, NY (US); Christian Schuster, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 10/722,432

(22) Filed: Nov. 28, 2003

(65) Prior Publication Data

US 2005/0116013 A1 Jun. 2, 2005

(51) Int. Cl.
*B23K 31/00* (2006.01)
*B23K 31/02* (2006.01)
(52) U.S. Cl. ...................... 228/180.5; 228/4.5
(58) Field of Classification Search ............ 228/180.5, 228/110.1, 1.1, 4.5
See application file for complete search history.

(56) References Cited

U.S. PATENT DOCUMENTS

| | | | |
|---|---|---|---|
| 3,840,169 A * | 10/1974 | Steranko et al. ............ 228/4.1 |
| 4,527,135 A | 7/1985 | Piper | |
| 4,555,052 A * | 11/1985 | Kurtz et al. ................ 228/104 |
| 4,602,338 A * | 7/1986 | Cook ........................... 702/65 |
| 4,686,492 A * | 8/1987 | Grellmann et al. ........... 333/33 |
| 5,294,897 A * | 3/1994 | Notani et al. ................. 333/33 |
| 5,477,083 A * | 12/1995 | Kawai ......................... 257/701 |
| 5,768,776 A | 6/1998 | Pendse | |
| 6,084,295 A * | 7/2000 | Horiuchi et al. ............ 257/690 |
| 6,534,854 B1 | 3/2003 | Fazelpour et al. | |
| 6,576,983 B1 | 6/2003 | Fazelpour et al. | |
| 2001/0015490 A1* | 8/2001 | Lee ............................ 257/693 |
| 2004/0182911 A1* | 9/2004 | Chia et al. ............... 228/180.5 |

OTHER PUBLICATIONS

U.S. Appl. No. 10/241,403, filed Sep. 11, 2002, Opryske et al.

* cited by examiner

*Primary Examiner*—Jonathan Johnson
*Assistant Examiner*—Rachel E. Beveridge
(74) *Attorney, Agent, or Firm*—Anne V. Dougherty, Esq.; McGinn IP Law Group, PLLC

(57) ABSTRACT

A method (and structure) of making an electronic interconnection, includes, for a signal line to be interconnected, using a plurality of bonding wires configured to provide a controlled impedance effect.

25 Claims, 3 Drawing Sheets

METHOD AND STRUCTURE FOR CONTROLLED IMPEDANCE WIRE BONDS USING CO-DISPENSING OF DIELECTRIC SPACERS

BACKGROUND OF THE INVENTION

1. Field of the Invention

The present invention generally relates to wire bonding of devices to the next level of packaging or between devices within a package. More specifically, to improve wide bandwidth signal transmission, the parasitic inductance can be lowered and compensated with distributed capacitance by tightly spacing a plurality of bond wires and/or bond ribbons so that the resulting impedance can be controlled for wide bandwidth signal transmission.

2. Description of the Related Art

Transition of signals between a device and the next level of packaging (e.g., a semiconductor device and package), or between devices is often achieved by using bond wires (also referred to herein as bonding wires). FIG. 1A shows a top view 100 and FIG. 1B shows a side view 101 of a typical round wire bonding technique. In this example, round wire 102 is bonded to pad 103 mounted on chip 104.

SUMMARY OF THE INVENTION

Bond wires can vary both in shape (round or flat) and width (e.g., typically 1-8 mils), as well as length (e.g., typically 100-1000 µm). These bond wires represent, in most practical cases, a parasitic inductive element in the signal path which limits the transmission of wide bandwidth signals. This is equivalent to stating that they represent a high characteristic impedance transmission line segment which can impair signal integrity.

There are various solutions in the art that address this problem. For example, the size of the transition can be reduced by using a flip chip concept or ball grid array packages, in which contacts of a chip or device are directly bonded to an adjacent chip, substrate, or device. Another known solution is filling the transition region with a high dielectric constant material such as, for example, an epoxy containing a ceramic.

Although these solutions work, they are not applicable in all cases. For example, these solutions are not efficient in the sense that the high frequency signals in the transition might involve only a few of the interconnections in the transition. Therefore, the existing solutions become costly and inefficient to implement when only a minimal number of transition interconnections require special treatment for high frequency parasitic effects.

In view of the foregoing exemplary problems, drawbacks, and disadvantages of the conventional methods, an exemplary feature of the present invention is to provide a structure and method for bonding an electronic connection in a chip transition so that high frequency parasitics in the signal transmission can be reduced.

It is another exemplary feature of the present invention to provide a technique in which only specific connections having wide bandwidth signals can be prepared to reduce high frequency parasitics.

To achieve the above exemplary features and others, in a first exemplary aspect of the present invention, described herein is a method (and structure) of making an electronic interconnection, including, for a signal line to be interconnected, using a plurality of bonding wires configured to provide a controlled impedance effect.

In a second exemplary aspect of the present invention, described herein is a method of reducing high frequency parasitic effects in a chip transition by using the above-described method.

In a third exemplary aspect of the present invention, described herein is a method of fabricating an electronic component, including interconnecting a signal for a device in the electronic component by using the above-described method.

In a fourth exemplary aspect of the present invention, described herein is an electronic component that includes at least one signal interconnected in the above-described manner.

In a fifth exemplary aspect of the present invention, described herein is an electronic apparatus that includes at least one electronic component having at least one signal interconnected in the above-described manner.

In a sixth exemplary aspect of the present invention, described herein is a method of providing a signal from a chip, including, for a signal of the chip, providing a controlled impedance signal line that includes a plurality of bonding wires configured to be separated by a predetermined distance.

The present invention provides a technique in which product costs can be reduced without a sacrifice in electrical performance. Improved signal transmission at higher data rates permitted by this invention will allow lower cost bond wire technologies to be applied to digital systems with ever increasing clock frequencies. Alternatively, the lower cost bond wire system of the present invention could replace more expensive packaging configurations currently used for high speed digital systems.

BRIEF DESCRIPTION OF THE DRAWINGS

The foregoing and other exemplary features, aspects and advantages will be better understood from the following detailed description of an exemplary embodiment of the invention with reference to the drawings, in which.

DETAILED DESCRIPTION OF A PREFERRED EMBODIMENT OF THE INVENTION

Figure 1A:
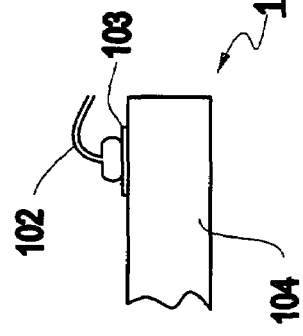
FIG. 1A shows the top view 100 and FIG. 1B shows a side view 101 of the wire bonding technique typically used in chip transitions.

Referring now to the drawings, and more particularly to FIGS. 2A-5, exemplary embodiments of the present invention will now be described.

It is noted that one of ordinary skill in the art, after having read the details described herein, would readily be able to apply the present invention as a method of producing a transition for a chip to interconnect the chip to terminals of a package, interconnecting chips within a package, interconnecting a chip to a board, or otherwise interconnecting the chip.

However, although the present invention is discussed in the environment of a chip transition, there is no intent that it be thus limited, since one of ordinary skill in the art would readily recognized that the concept can be generalized as applying more generically (e.g., to electronic interconnections).

That is, the present invention can equally be applied to, for example, to integrated circuits, semiconductor devices, passive devices, filters, and so on.

Moreover, it is also intended that the present invention encompasses the concept of manufacturing a chip, device, electronic component, or electronic apparatus in accordance with the techniques discussed herein.

Additionally, it is intended that the products produced in accordance with these techniques, whether a chip, device, electronic component, or electronic apparatus, are also encompassed in the present invention.

The present invention presents a solution to the problem both for single-ended signals and for differential signals. In both cases the present invention lowers and compensates the parasitic inductance, and hence controls the impedance seen by the signal, to a degree that improved transmission properties can be achieved.

Single-Ended Signals:

The present invention takes advantage of a self-inductance decrease and a self-capacitance increase for a tightly-spaced pair of bonds, where one is the signal and one is the reference (ground). Theoretically, this effect can be calculated from the characteristic impedance formula for a transmission line:

$$Z_{se} = \text{sqrt}[L_{self}/C_{self}]$$

where $Z_{se}$ is the single-ended characteristic impedance, $L_{self}$ the self-inductance per unit length, and $C_{self}$ the self-capacitance per unit length. By bringing the $Z_{se}$ of the bonding wire interconnect down to the impedance of the surrounding interconnect system, an improved transmission can be achieved.

That is, the bonding technique of the present invention is intended to be a method by which can be maintained the impedance of the chip circuit and/or output circuit to which the bonding wiring interconnects the chip circuit. Ideally, the output impedance of the chip matches the impedance of the bonding wiring system of the present invention, and this bonding wire system impedance matches the impedance of the circuit to which the bonding wire system connects.

Figure 1B:
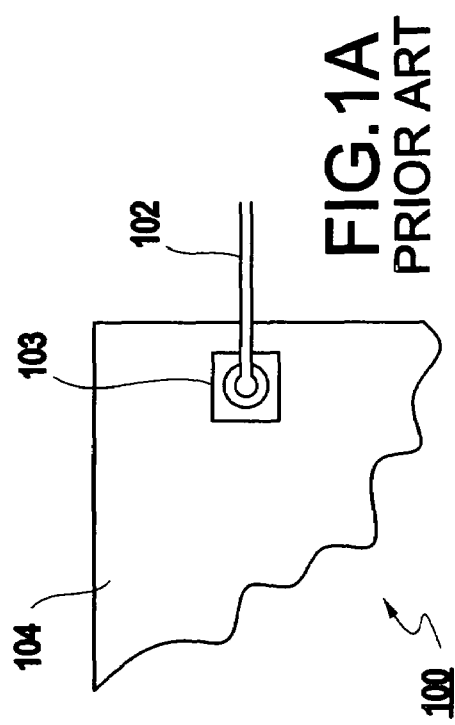
Figure 2A:
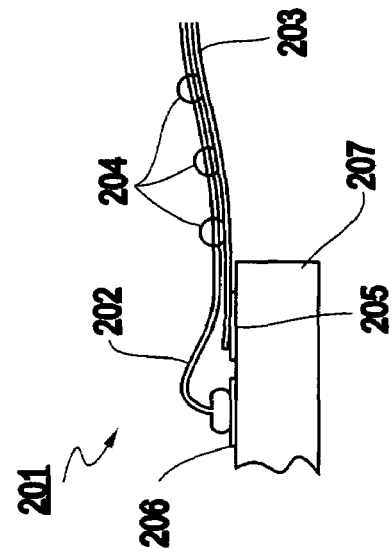
FIG. 2A shows the top view 200 and FIG. 2B shows the side view 201 of an exemplary embodiment of the present invention as implemented for single-ended signals which is analogous to a microstrip.
Figure 2B:
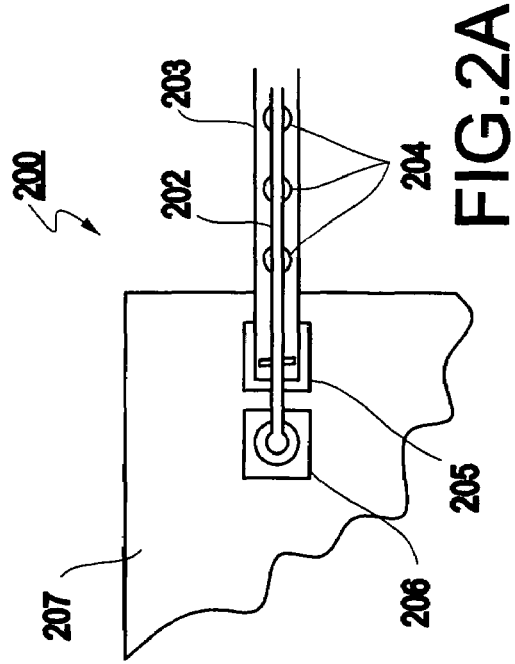

Specifically, two exemplary configurations are hereinbelow described, each with application to single-ended signaling configurations or to differential signaling configurations.

a) Microstrip:

In the exemplary embodiment shown in top view 200 and side view 201 in FIGS. 2A and 2B, respectively, a microstrip with a round wire bond 202 is closely spaced above a ribbon bond 203, on chip or package substrate 207. The round wire 202 and ribbon wire 203 would typically be dispensed together and tacked at either periodic intervals or continuously with, for example, ultraviolet (UV) cured epoxy 204 to maintain the proper spacing. This would require some modification of the bond pad geometry as shown in FIGS. 2A and 2B, where an additional bond pad 205 in close proximity provides a return path for the higher frequency components of the signal present on bond pad 206, compared to the conventional technique shown in FIGS. 1A and 1B where the return path is not clearly assigned.

The ribbon wire 203 is much wider than the round wire 202 (e.g., typically, at least twice as wide). Both wires 202, 203 can be stitched down with one custom shaped tip or fabricated in a two-step sequence in which the ribbon wire is bonded first. In current practice, the bonding wires 202, 203 would typically be gold or aluminum, but one of ordinary skill in the art would recognize that any other materials or alloys used for bonding could also be used.

Although FIG. 2 shows periodically dispensed adhesive (e.g. epoxy) in the form of beads 204, the adhesive can be continuously co-dispensed with the wires 202, 203, which would have a more significant effect on the line impedance.

Suitable choice of dielectric properties allows a reasonable tradeoff to be made between the vertical spacing of the round wire 202 above the ribbon ground reference 203 and dielectric loss.

One of ordinary skill in the art would readily recognize that, given a target impedance to match with one of the bonding wire transmission configurations of the present invention, the equation for the characteristic impedance for that configuration provides the information to calculate the separation between wires and the dielectric constant (e.g., choice of dielectric to use).

One of ordinary skill in the art would also readily recognize that variations of the structure shown in FIGS. 2A and 2B are possible, since a key aspect of the present invention is that of obtaining a controlled impedance connection in chip transitions. As examples of variations, the ribbon wire 203 might be above the round wire 202, or both conductors 202, 203 might be round wires or ribbon wires.

b) Coplanar Waveguide

Figure 3A:
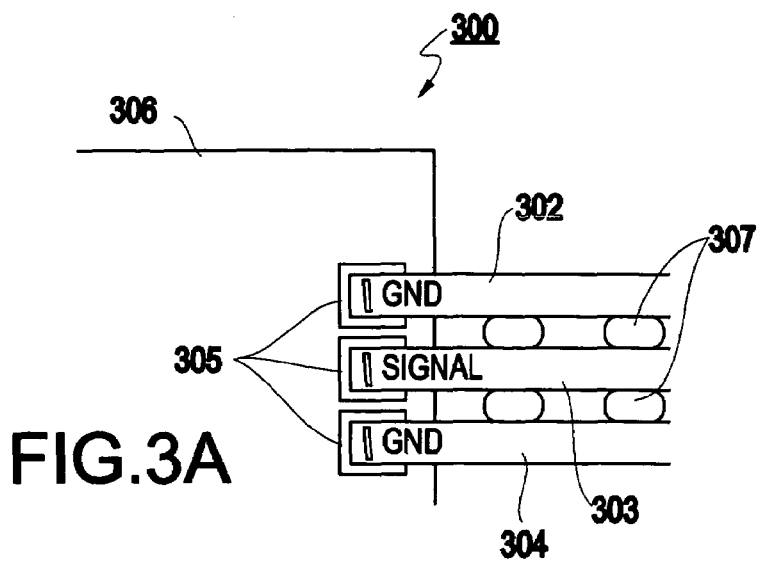
FIG. 3A shows the top view 300 and FIG. 3B shows the side view 301 of an exemplary embodiment of the present invention as implemented for single-ended signals which is analogous to a coplanar waveguide.
Figure 3B:
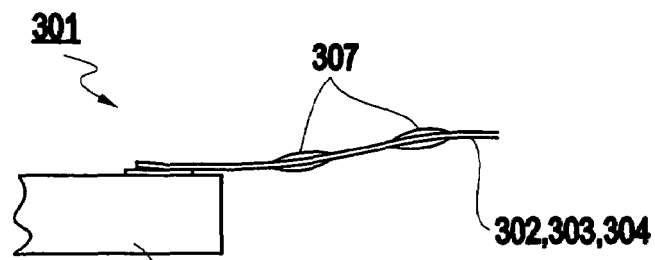

A second exemplary variant on the present invention utilizes a coplanar waveguide (CPW) arrangement, exemplarily illustrated in a top view 300 and a side view 301 of FIGS. 3A and 3B, respectively. Although FIGS. 3A and 3B exemplarily show a ribbon-ribbon-ribbon configuration using ribbons 302, 303, 304, other variations, such as ribbon-wire-ribbon could be implemented. It is noted that this example uses center ribbon 303 as the signal conductor and outside ribbons 302, 304 as ground conductors.

This second embodiment has the advantage of using a more conventional linear pad 305 geometry on the chip 306. Similar to the first embodiment, a preferred technique in this second embodiment would bond all three conductors 302, 303, 304 of the CPW (coplanar waveguide) at the same time, with periodic or continuous spacers 307 of UV cured epoxy or other suitable adhesive as needed.

Differential Signals:

The present invention can also be extended to take advantage of the mutual inductive and capacitive coupling between adjacent bonding wires which are carrying differential signals (i.e., signals of opposite polarity). This aspect increases both coupling terms, thus lowering the effective impedance. Theoretically, this effect can be calculated from the characteristic impedance formula for a differential pair of transmission lines:

$$Z_{diff} = 2*\text{sqrt}[(L_{self} - L_{mutual})/(C_{self} + 2*C_{mutual})],$$

where $Z_{diff}$ is the differential mode characteristic impedance, $L_{self}$ the self-inductance per unit length, $L_{mutual}$ the mutual inductance per unit length, $C_{self}$ the self-capacitance per unit length, and $C_{mutual}$ the mutual capacitance per unit length.

By bringing the $Z_{diff}$ of the bonding wire interconnect to be near to (or the same as) the impedance of the surrounding interconnect system, an improved transmission can be achieved. In contrast to the single-ended case, $L_{mutual}$ and $C_{mutual}$ and not $L_{self}$ and $C_{self}$ are used for lowering of the characteristic impedance (decrease of $L_{mutual}$ and increase of $C_{mutual}$).

Technically, the change in $L_{mutual}$ and $C_{mutual}$ is achieved by placing the bonding wires in a close, controlled distance. Of course, shorts between bonding wires have to be avoided, which can be achieved, as before, by co-dispensing the wires with a suitable dielectric.

Alternatively, a suitable, insulating dielectric (e.g., such as Kapton®) to which the wire bonds are attached could be used. In this case, the bonding wires are attached to the dielectric before placing them, similar to the technique used in the tape automated bonding system in which conductors are adhered to the surface of a dielectric tape.

Choice of Bond Distance and Dielectric:

Both the thickness and the dielectric constant of the dielectric determine the achieved $Z_{se}$ or $Z_{diff}$. There may be a choice of dielectric thicknesses (20-50-100 µm) which allows tailoring to suit a specific application having, for example, space constraints or desired coupling.

By mixing in high dielectric constant particles (e.g., glass or ceramic), either uniformly in the adhesive or in a spatially varying fashion, the capacitive coupling can be adjusted separately to be either constant or a controlled function of distance along the lines.

Extension to Filters and Impedance Transformers

If controlled impedance discontinuities in these structures are created (e.g., by dispensing the dielectric in discrete beads instead of continuously), the equivalent of lumped element filters and matching networks within the wirebond connection can be implemented. Although this would only be practical at much higher frequencies than discussed heretofore, this would have the advantage of implementing additional circuit functionality with no additional packaging or component costs. Concepts well known in microwave passive filter design would be used to implement this aspect of the present invention.

Results for a Prototype from Numerical Simulation

Figure 4:
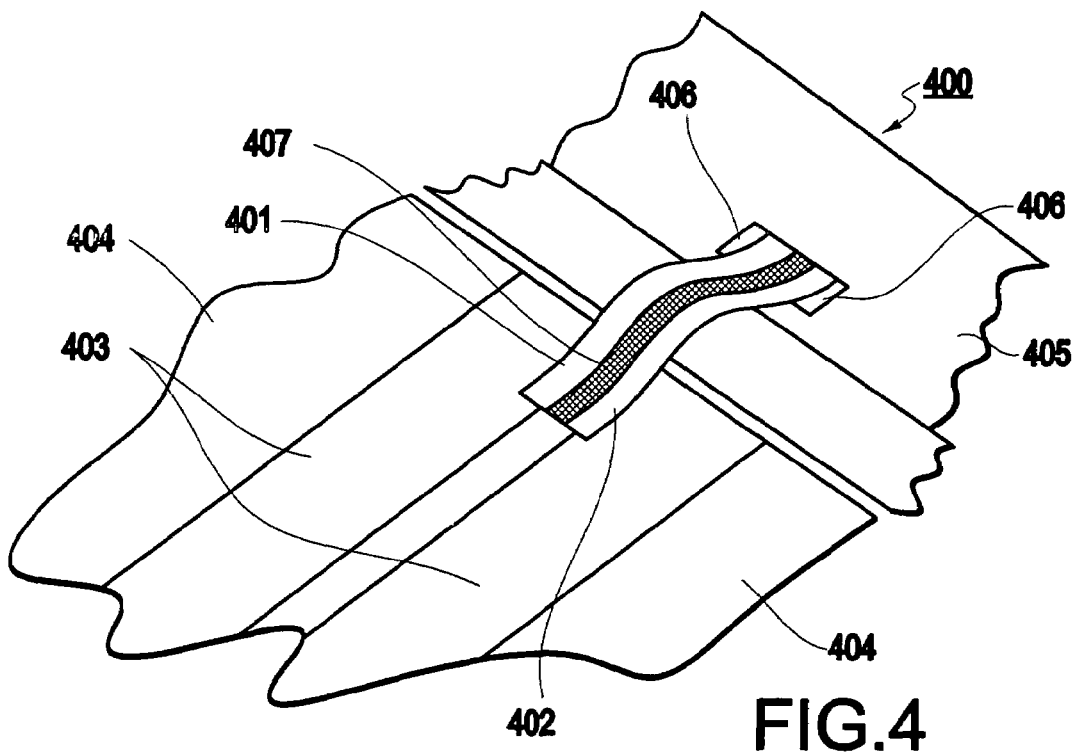
FIG. 4 shows an exemplary configuration 400 applied to a differential signal and which is used for testing by numerical simulation.
Figure 5:
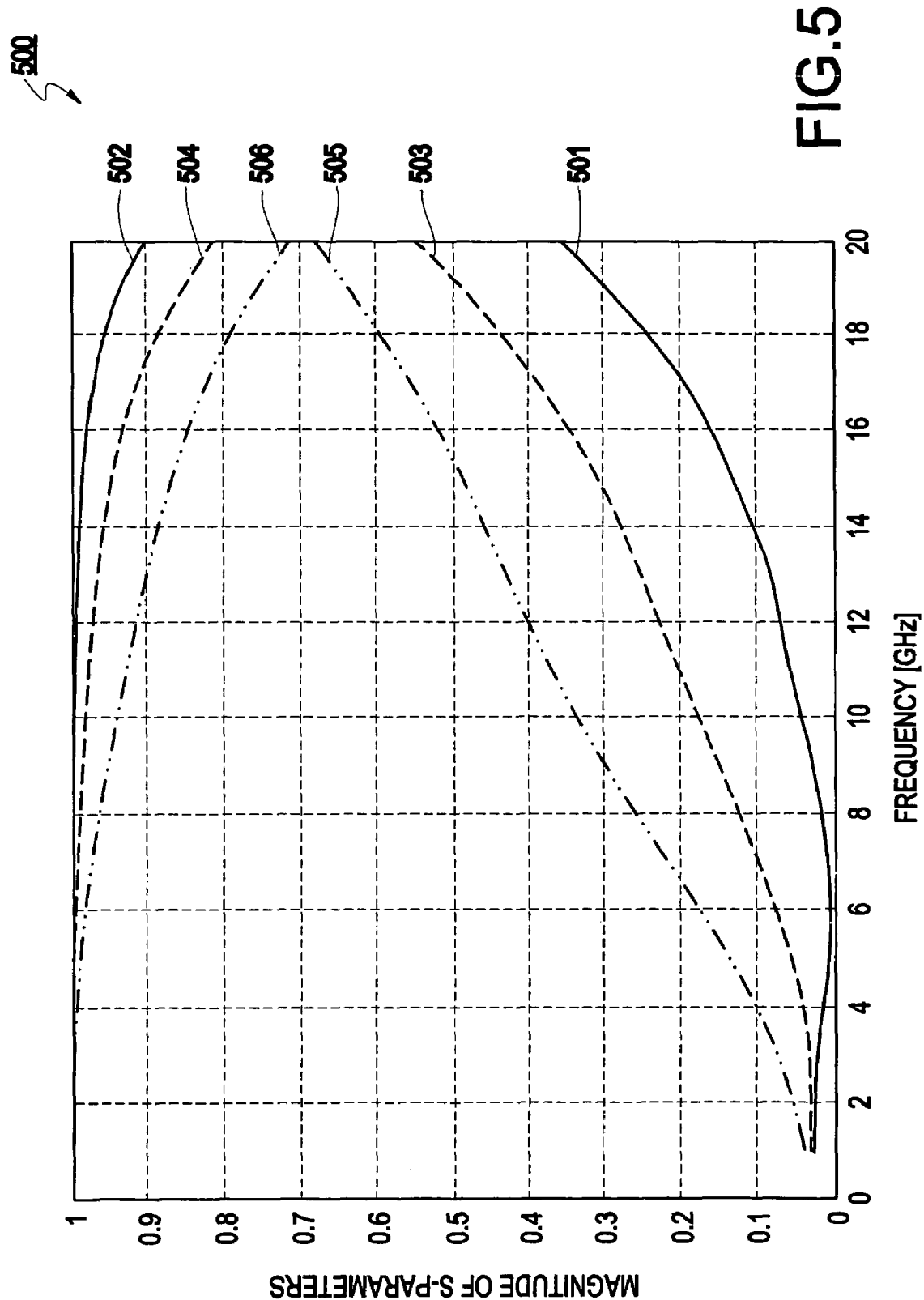
FIG. 5 shows a result 500 of this numerical simulation of FIG. 4.

FIG. 4 shows an exemplary configuration 400 in accordance with concepts of the present invention that was used for testing by numerical simulation. FIG. 5 shows results 500 of the simulation of FIG. 4.

As shown in FIG. 4, a pair of approximately 3 mil wide ribbon bonds 401, 402 are used in differential signaling from microstrips 403 on a ceramic substrate 404 to a chip 405 having contact pads 406. The dielectric spacer 407 in this case is about 3 mil wide.

Comparison of reflection and transmission properties of differential ribbon bond interconnect are shown. Curve 501 shows the reflection with approximately 1 mil distance separation of ribbon wires with a continuous spacer having dielectric constant of 4.4, and curve 502 shows the transmission properties of this first simulation example.

Curve 503 shows a second example, in which the reflection with approximately 3 mil distance separation of ribbon wires with a continuous spacer having dielectric constant 4.4, and curve 504 shows the transmission properties of this second example.

Curve 505 shows a third example in which the reflection with 10 mil separation of ribbon wires with no spacer, and curve 506 shows the transmission properties of this third example. Clearly the 1 mil spacing example performs best.

Improved signal transmission at higher data rates permitted by this invention will allow lower cost bond wire technologies to be applied to digital systems with ever increasing clock frequencies. Alternatively, more expensive packaging configurations that are currently used for high speed digital systems could be migrated to a lower cost bondwire configuration. In either case, product costs would be reduced without a sacrifice in electrical performance.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

The invention claimed is:

1. A method of making an electronic interconnection, said method comprising:

for a signal line to be interconnected, using a plurality of bonding wires configured to provide a controlled impedance effect by co-dispensing said bonding wires in said plurality of bonding wires so that said bonding wires are separated by a predetermined distance and by co-dispensing a dielectric material with said bonding wires, said dielectric material thereby maintaining said predetermined distance of said bonding wires to provide at least a part of said controlled impedance effect.

2. The method of claim 1, wherein said plurality of bonding wires is configured such that a first bonding wire is located a predetermined distance above a second bonding wire to provide at least a part of said controlled impedance effect.

3. The method of claim 1, wherein said plurality of bonding wires is configured such that a first bonding wire is located a predetermined distance alongside a second bonding wire to provide at least a part of said controlled impedance effect.

4. The method of claim 3, wherein a third bonding wire is located a predetermined distance alongside said first bonding wire and said second bonding wire.

5. The method of claim 1, wherein one of a first bonding wire and a second bonding wire of said plurality of bonding wires is grounded.

6. The method of claim 1, wherein said dielectric material is periodically placed along a length of said plurality of bonding wires.

7. The method of claim 6, wherein a spacing of said dielectric material permits an effect of one of a filter and an impedance transformer.

8. The method of claim 1, wherein said dielectric material is continuously placed along a length of said plurality of bonding wires.

9. The method of claim 1, wherein said dielectric material comprises an ultraviolet-cured epoxy.

10. The method of claim 1, wherein said bonding wires of said signal line comprise a plurality of round bonding wires.

11. The method of claim 1, wherein said bonding wires of said signal line comprise a plurality of ribbon bonding wires.

12. The method of claim 1, wherein said bonding wires of said signal line comprise a combination of at least one round bonding wire and at least one ribbon wire.

13. The method of claim 1, wherein said plurality of bonding wires for said signal comprises a microstrip.

14. The method of claim 1, wherein said plurality of bonding wires for said signal comprises a coplanar waveguide.

15. The method of claim 1, wherein said signal comprises a single-ended signal.

16. The method of claim 1, wherein said signal comprises a differential signal.

17. The method of claim 1, wherein said dielectric material includes particles having a high dielectric constant.

18. The method of claim 17, wherein said particles comprise at least one of glass and ceramic.

19. The method of claim 17, wherein a spacing of intervals of said particles permits an effect of one of a filter and an impedance transformer.

20. The method of claim 1, wherein both a signal current and a return current are conducted by said plurality of bonding wires.

21. The method of claim 1, wherein said controlled impedance effect results from an electromagnetic coupling amongst the bonding wires in said plurality of bonding wires for said signal line.

22. A method of reducing high frequency parasitic effects in a chip transition, said method comprising:
for a signal in said transition, using a plurality of bonding wires configured to provide a controlled impedance effect as due to a predetermined distance between said plurality of bonding wires and a dielectric material co-dispensed with said plurality of bonding wires.

23. A method of fabricating an electronic component, said method comprising:
for a device in said electronic component, using a plurality of bonding wires configured to provide a controlled impedance effect for a signal line connecting to said device, wherein said controlled impedance is due to a predetermined distance between said plurality of bonding wires for said signal line and a dielectric material co-dispensed with said plurality of bonding wires.

24. A method of providing a signal from a chip, said method comprising:
for a signal of said chip, providing a controlled impedance signal line comprising a plurality of bonding wires configured to be separated by a predetermined distance, said controlled impedance being designed to be near in a value to at least one of an impedance of a circuit of said chip and an impedance of a circuit to which said signal line is interconnecting said chip circuit,
wherein said predetermined distance is maintained by a dielectric material, said controlled impedance being determined by said predetermined distance and a dielectric constant of said dielectric material and established by co-dispensing said plurality of bonding wires and co-dispensing said dielectric material with said plurality of bonding wires during a fabrication of said chip.

25. The method of claim 24, wherein said plurality of bonding wires are arranged in one of a micro strip configuration and a coplanar waveguide configuration.

* * * * *